(12) United States Patent
Su et al.

(10) Patent No.: US 8,440,500 B2
(45) Date of Patent: May 14, 2013

(54) LIGHT EMITTING DEVICE

(75) Inventors: Hwa Su, Taipei (TW); Hsi-Yan Chou, Taipei (TW); Chih Wei Huang, Linyuan Township (TW)

(73) Assignee: InterLight Optotech Corporation, Taoyuang (TW)

( * ) Notice: Subject to any disclaimer, the term of this patent is extended or adjusted under 35 U.S.C. 154(b) by 111 days.

(21) Appl. No.: 12/781,194

(22) Filed: May 17, 2010

(65) Prior Publication Data

US 2010/0295070 A1 Nov. 25, 2010

Related U.S. Application Data

(60) Provisional application No. 61/180,065, filed on May 20, 2009.

(51) Int. Cl.
*H01L 51/40* (2006.01)
*H01L 21/00* (2006.01)

(52) U.S. Cl.
USPC ............... 438/99; 438/26; 438/116; 438/88

(58) Field of Classification Search ............ 257/88, 257/99; 438/26, 116
See application file for complete search history.

(56) References Cited

U.S. PATENT DOCUMENTS

| | | | |
|---|---|---|---|
| 5,998,925 A | 12/1999 | Shimizu | |
| 6,614,103 B1 * | 9/2003 | Durocher et al. | 257/678 |
| 7,311,858 B2 | 12/2007 | Wang | |
| 7,360,924 B2 * | 4/2008 | Henson et al. | 362/241 |
| 7,390,437 B2 | 6/2008 | Dong | |
| 7,575,697 B2 | 8/2009 | Li | |
| 7,601,276 B2 | 10/2009 | Li | |
| 2003/0189829 A1 * | 10/2003 | Shimizu et al. | 362/240 |
| 2005/0139846 A1 * | 6/2005 | Park et al. | 257/98 |
| 2006/0124953 A1 | 6/2006 | Negley et al. | |
| 2006/0158090 A1 | 7/2006 | Wang | |

(Continued)

FOREIGN PATENT DOCUMENTS

WO WO2009/060219 A2 5/2009

OTHER PUBLICATIONS

International Search Report and Written Opinion dated Jul. 20, 2010 for International Application No. PCT/US2010/035307.

*Primary Examiner* — Fernando L Toledo
*Assistant Examiner* — Karen Kusumakar
(74) *Attorney, Agent, or Firm* — CKC & Partners Co., Ltd.

(57) ABSTRACT

A light emitting device comprises a plurality of LED chips ("lateral" or "vertical" conducting) operable to generate light of a first wavelength range and a package for housing the chips. The package comprises: a thermally conducting substrate (copper) on which the LED chips are mounted and a cover having a plurality of through-holes in which each hole corresponds to a respective one of the LED chips. The holes are configured such that when the cover is mounted to the substrate each hole in conjunction with the substrate defines a recess in which a respective chip is housed. Each recess is at least partially filled with a mixture of at least one phosphor material and a transparent material. In a device with "lateral" conducting LED chips a PCB is mounted on the substrate and includes a plurality of through-holes which are configured such that each chip is directly mounted to the substrate. For a device with "vertical" conducting LED chips the LED chips are mounted on a diamond like carbon film.

22 Claims, 9 Drawing Sheets

U.S. PATENT DOCUMENTS

| | | |
|---|---|---|
| 2007/0029526 A1 | 2/2007 | Cheng |
| 2007/0189007 A1* | 8/2007 | Nishimoto et al. ........... 362/227 |
| 2008/0111472 A1 | 5/2008 | Liu |
| 2008/0112162 A1 | 5/2008 | Chan |
| 2008/0128739 A1 | 6/2008 | Sanpei et al. |
| 2009/0050907 A1 | 2/2009 | Yuan et al. |
| 2009/0101930 A1 | 4/2009 | Li et al. |
| 2009/0283721 A1 | 11/2009 | Liu |
| 2009/0294780 A1 | 12/2009 | Chou |

* cited by examiner

US 8,440,500 B2

LIGHT EMITTING DEVICE

CROSS-REFERENCE TO RELATED APPLICATIONS

This application claims the benefit of priority of U.S. Provisional Application No. 61/180,065, filed May 20, 2009 and entitled "Light Emitting Device" by Hwa S U et al., the contents of which are incorporated herein by reference.

BACKGROUND OF THE INVENTION

1. Field of the Invention

This invention relates to light emitting devices and more especially to packaging arrangements for such devices. In particular, although not exclusively, the invention relates to light emitting devices which include one or more phosphor (photo-luminescent) materials to generate a desired emission product color. Moreover embodiments of the invention concern, but are not limited to, white light generating devices for general lighting applications with a high emission intensity (i.e. a luminous flux of more than 500 lumens) that are based on light emitting diodes (LEDs).

2. Description of the Related Art

White light emitting LEDs ("white LEDs") are known in the art and are a relatively recent innovation. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photo-luminescent materials, which absorb a portion of the radiation emitted by the LED and re-emit radiation of a different color (wavelength). Typically, the LED chip generates blue light and the phosphor material(s) absorbs a percentage of the blue light and re-emits yellow light or a combination of green and red light, green and yellow light or yellow and red light. The portion of the blue light generated by the LED that is not absorbed by the phosphor material combined with the light emitted by the phosphor material provides light which appears to the human eye as being nearly white in color.

Currently there is a lot of interest in using high brightness white LEDs as energy efficient replacements for conventional incandescent light bulbs, halogen reflector lamps and fluorescent lamps. Most lighting devices utilizing LEDs comprise arrangements in which a plurality of LEDs replaces the conventional light source component. A problem with such existing light emitting devices, in particular white light emitting devices intended for general lighting which typically require an emitted luminous flux of 500 lumens or greater (i.e. an input power of typically 5 W to 10 W), is thermal management and in particular adequately dissipating heat generated by such devices. A further problem is thermal degradation of the phosphor material with time which can result in a significant change in the correlated color temperature (CCT) and/or luminous flux of light emitted by the device. Typically the packaged device is mounted on a heat sink or other large thermal mass to dissipate heat. However, the thermal resistance of the package can make it difficult to adequately transfer heat from the LED chips (dies) through the package which is often fabricated from an electrically insulating material such as a high temperature polymer or ceramic.

An example of a white LED package is disclosed in co-pending U.S. patent application Publication No. US 2009/0294780A1 (Published Dec. 3, 2009) to Chou et al. A schematic sectional view of such a package is shown in FIG. 1. The white light emitting device 10 comprises a square array of blue (i.e. wavelength≈400 to ≈480 nm) surface emitting InGaN/GaN (indium gallium nitride/gallium nitride) based light emitting diode (LED) chips 12 packaged in a high temperature package 14 such as for example a low temperature co-fired ceramic (LTCC) package. The package 14 has in an upper surface a square array of circular recesses (cups) 16, each of which is configured to receive a respective LED chip 12. The package 14 further comprises a pattern of electrically conducting tracks 18 that define electrical contact pads on the floor of each recess 16 and a thermally conducting mounting pad 20. The mounting pad 20 is thermally connected with a corresponding mounting pad 22 on the base of the package by an array of thermally conducting vias 24. The package 14 further comprises electrical connectors 26, 28 on the base of the package for providing electrical power to the device. Each LED chip 12 is mounted to the mounting pad 20 of a respective recess 16 using for example a thermally conductive adhesive or eutectic soldering. Electrode contacts on the upper surface of the LED chip 12 are electrically connected to a corresponding electrical contact pad on the floor of the recess by bond wires 30 and each recess 16 is completely filled with a transparent polymer material 32, typically a silicone, which is loaded with a powdered phosphor material 34 to ensure that the exposed surfaces of the LED chip 12 are covered by the phosphor/polymer material mixture. To enhance the emission intensity (luminous flux) of the device the walls of the recess are inclined such that each recess comprises a reflector. Whilst such a device package performs well both electrically and thermally (i.e. thermal resistance is typically 8 to 10° C./W), such packages are relatively expensive to fabricate which can limit the applications for which they are cost effective.

Another packaging arrangement comprises mounting the LED chip directly on a metal core printed circuit board (MCPCB) and then encapsulating the LED chip with a phosphor encapsulation. Such a configuration is often termed a chip on board (COB) arrangement. As is known an MCPCB comprises a layered structure comprising a thermally conducting base, typically aluminum, an electrically non-conducting/thermally conducting dielectric layer and electrically conducting circuit layer typically made of copper. The dielectric layer is very thin such that they can conduct heat from components mounted on the circuit layer to the base. As disclosed in co-pending U.S. patent application Ser. No. 12/689,449 entitled "Light emitting devices with phosphor wavelength conversion and methods of manufacture thereof" (filed Jan. 19, 2010) to Li et al. the phosphor encapsulation can be in the form of a substantially conformal coating that is molded on the LED chip. Alternatively, as disclosed in co-pending U.S. patent application Ser. No. 12/639,688 entitled "Light emitting devices with phosphor wavelength conversion" (filed Dec. 16, 2009) to Li et al. the phosphor material can be provided on the inner surface of a light transmissive hemispherical shell that is mounted over the LED chip to form a moisture/gas tight enclosure. It is also known to incorporate the phosphor material within a hemispherical lens that is formed over the LED chip by for example molding. Whilst the thermal resistance of an MCPCB is excellent and can be as low as 1.5° C./W the cost of such a packaging arrangements, in particular the cost of applying phosphor material to individual LED chips, can be prohibitively expensive in the highly competitive cost conscious general lighting sector. Moreover with such a packaging arrangement it can be difficult to produce devices with a consistent CCT.

It has also been proposed to mount an array of LED chips on an MCPCB and then encapsulate the entire array of the LED chips with a phosphor coating that is contained within a peripheral frame (for example a circular annular frame) mounted to the MCPCB such as to surround the array of LEDs. Whilst a package with a single recess is easy to fabricate such an arrangement requires additional phosphor material to fill the regions between adjacent chips and that such phosphor material contributes little or nothing to light generation for a surface emitting LED chips. It is believed that the additional phosphor material can absorb light and reduce the devices overall light emission. Initial tests suggest that a package having a single recess that houses a number of LED chips has a lower luminous efficacy (e.g. 50 to 55 lm/W) compared with a package in which the same number of LED chips are each housed in a respective cavity (e.g. 70 to 80 lm/W). Moreover, it is believed that thermal degradation of the phosphor material maybe higher in a device where a single recess housing multiple LED chips.

A need still exists for a less expensive light emitting device package with a thermal resistance that is comparable with an MCPCB and which enables easy application of the one or more phosphor materials.

SUMMARY OF THE INVENTION

The present invention arose in an endeavor to provide a packaging arrangement for a light emitting device with good thermal characteristics, in particular a low thermal resistance, that is suitable for LED chips that generate light with a luminous flux of at least 500 lumens.

According to the invention a light emitting device comprises: a plurality of LED chips operable to generate light having a dominant wavelength in a first wavelength range; and a package for housing the chips, wherein the package comprises: a thermally conductive substrate on which the LED chips are mounted; and a cover having a plurality of through-holes in which each hole corresponds to a respective one of the LED chips and wherein the holes are configured such that when the cover is mounted to the substrate each hole in conjunction with the substrate defines a recess in which a respective LED chip is housed. Advantageously, the package has a thermal resistance of less than ≈5° C./W and more preferably less than ≈2° C./W.

In order for the device to generate a desired color of light or white light with a selected correlated color temperature (CCT), each recess can be at least partially filled with a mixture of at least one phosphor material and a light transmissive material. The at least one phosphor material is configured to absorb at least a portion of the light emitted by the LED chips and to emit light having a dominant wavelength in a second wavelength range. Typically, the emission product of the device appears white in color and comprises a combination of light of the first and second wavelength ranges. Alternatively, the emission product of the device can comprise light generated by the at least one phosphor material. Providing a respective recess for each LED chip provides the benefit of reducing the quantity of phosphor material required as compared with known packages in which a single recess is used to house an array of LED chips. Moreover, it has been found that such a package has an improved brightness compared to the known packages. Typically, the cover is essentially planar and the recesses can conveniently be filled by sweeping (drawing) the phosphor/polymer mixture over the surface of the cavity cover using a flexible blade such as doctor blade, squeegee or alike. A benefit of such a method is that it eliminates the need to dispense a measured quantity of phosphors into each recess and thereby reduces costs.

In terms of fabrication the cover can be mounted to the substrate and the LED chips then mounted to the substrate within a respective recess. Alternatively the LED chips can be mounted and electrically connected to the substrate and the cover then mounted to the substrate. Such a construction enables mounting and connection of the LED chips to be carried out on an essentially planar substrate allowing the use of chip on board (COB) fabrication techniques.

To minimize the thermal resistance of the package and to maximize dissipation of heat, the substrate has as high a thermal conductivity as possible and is preferably of order of at least 200 $Wm^{-1} K^{-1}$. The substrate is preferably a metal advantageously copper or a copper alloy, though it can comprise other metals or alloys such as aluminum, an aluminum alloy, a magnesium alloy or a thermally conducting ceramic such as aluminum silicon carbide (AlSiC) or a carbon composite.

Advantageously the cover is also made of a material that is a good thermal conductor and has a thermal conductivity of at least 150 $Wm^{-1} K^{-1}$ and preferably at least 200 $Wm^{-1} K^{-1}$. Such a cover can provide heat sinking of the phosphor material and reduce potential thermal degradation of the phosphor material. The cover preferably comprises a metal, advantageously copper or a copper alloy, though it can comprise other metals or alloys such as aluminum, an aluminum alloy, a magnesium alloy or a thermally conducting ceramic such as aluminum silicon carbide (AlSiC) or a carbon composite.

In one arrangement intended for LED chips having a "lateral" conducting structure in which both LED electrodes are located on the same face, typically the light emitting surface of a surface emitting LED, the device further comprises an electrical circuit arrangement mounted on the substrate which has a plurality of through-holes configured such that each chip is directly mounted to the substrate. In this specification "directly mounted" means mounted in direct thermal communication without intervening layer(s) and includes soldering the chips to the substrate. Each LED chip is electrically connected to the circuit arrangement using for example bond wires. The circuit arrangement preferably comprises a printed circuit board (PCB) such as an FR-4 PCB. A particular advantage of this packaging arrangement is that each LED chip is mounted in direct thermal communication with a high thermal conductivity substrate and this provides a very low thermal resistance and improved heat sinking of the chips compared with the known solutions. Additionally, the use of a circuit layer overlying the chips to provide electrical connection of the LED chips ensures complete electrical isolation from the substrate. This is beneficial for devices intended for use in general lighting, which are often required to operate from high voltage alternating current supplies of 110V or 220V.

In an alternative packaging arrangement for LED chips having a "vertical" conducting structure in which the LED electrodes are located on opposite faces of the chip, the LED chips are mounted on and electrically connected to a circuit arrangement on the surface of the substrate. In this arrangement the LED chips are not directly mounted to the substrate. The circuit arrangement preferably comprises an electrically insulating thermally conductive layer having an arrangement of electrical conductors on a surface thereof and each LED chip is mounted to an electrical conductor. The thermally conductive layer preferably comprises diamond like carbon (DLC) also referred to as "amorphous carbon" or "amorphous diamond". The DLC is preferably in the form of a thin film (typical thickness 5 to 50 µm) and can be deposited on the substrate using for example chemical vapor deposition.

To focus or otherwise direct light emission the device can further comprise an optical component, typically a lens, overlying one or more of the recesses. The lenses can be in the form of individual components or integrated in the form of an array.

According to a another aspect of the invention a light emitting device comprises: a thermally conductive substrate; a plurality of LED chips; an electrical circuit arrangement mounted on the substrate wherein the circuit arrangement has a plurality of through-holes configured such that each chip is directly mountable to the substrate; a cover having a plurality of through-holes in which each hole corresponds to a respective one of the LED chips and wherein the holes are configured such that when the cover is mounted to the circuit arrangement each hole in conjunction with the circuit arrangement defines a recess in which a respective LED chip is housed; and wherein each recess is at least partially filled with a mixture of at least one phosphor material and a light transmissive material, the at least one phosphor material being configured to absorb at least a portion of light of the first wavelength range and to emit light having a dominant wavelength in a second wavelength range.

According to a further aspect of the invention a light emitting device comprises: a thermally conductive substrate; a plurality of LED chips; a circuit arrangement comprising an electrically insulating thermally conducting layer having an arrangement of electrical conductors on a surface thereof and wherein each LED chip is mounted to an electrical conductor; a cover having a plurality of through-holes in which each hole corresponds to a respective one of the LED chips and wherein the holes are configured such that when the cover is mounted to the circuit arrangement each hole in conjunction with the circuit arrangement defines a recess in which a respective LED chip is housed; and wherein each recess is at least partially filled with a mixture of at least one phosphor material and a light transmissive material, the at least one phosphor material being configured to absorb at least a portion of light of the first wavelength range and to emit light having a dominant wavelength in a second wavelength range.

According to yet a further aspect of the invention there is provided a package for a light emitting device comprising a plurality of LED chips operable to generate light of a first wavelength range; the package comprising: a thermally conductive substrate on which the LED chips are mountable; and a cover having a plurality of through-holes in which each hole corresponds to a respective one of the LED chips and wherein the holes are configured such that when the cover is mounted to the substrate each hole in conjunction with the substrate defines a recess in which a respective chip is housed.

Preferably the package of the invention has a thermal resistance of less than 5° C./W and more preferably less than 2° C./W.

BRIEF DESCRIPTION OF THE DRAWINGS

In order that the present invention is better understood embodiments of the invention will now be described, by way of example only, with reference to the accompanying drawings in which.

DETAILED DESCRIPTION OF THE INVENTION

Figure 1:
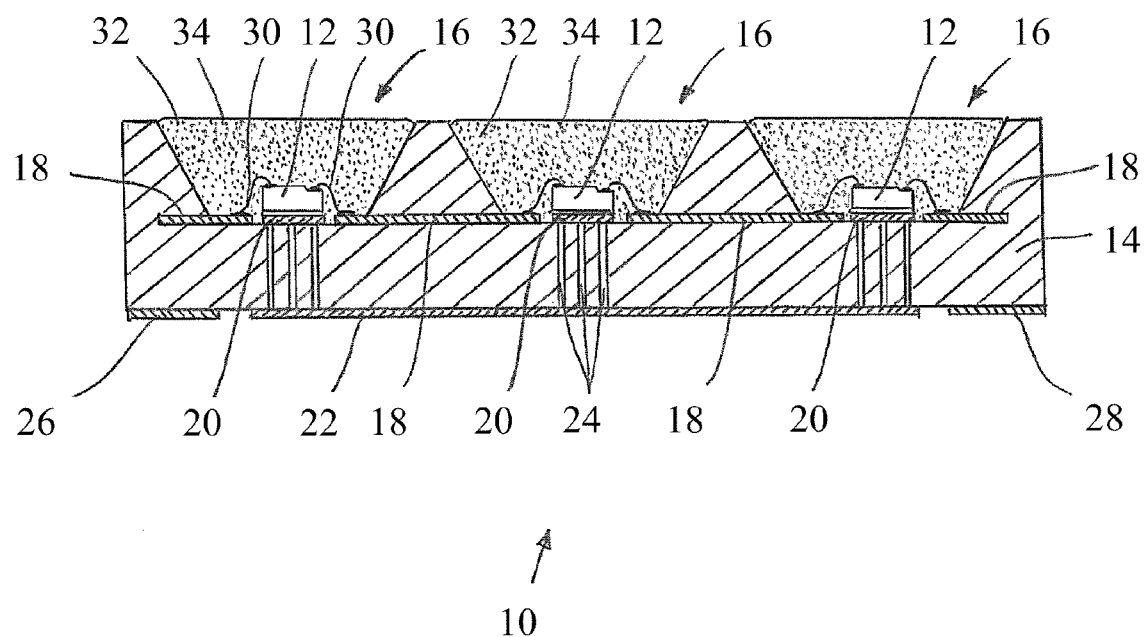
FIG. 1 is a schematic sectional view of a known white light emitting device as previously described.

Embodiments of the invention concern packaging arrangements for light emitting devices that include one or more phosphor materials to generate a desired color of light, typically white light with a selected CCT. In this specification like reference numerals are used to denote like parts.

Figures 2A, 2B:
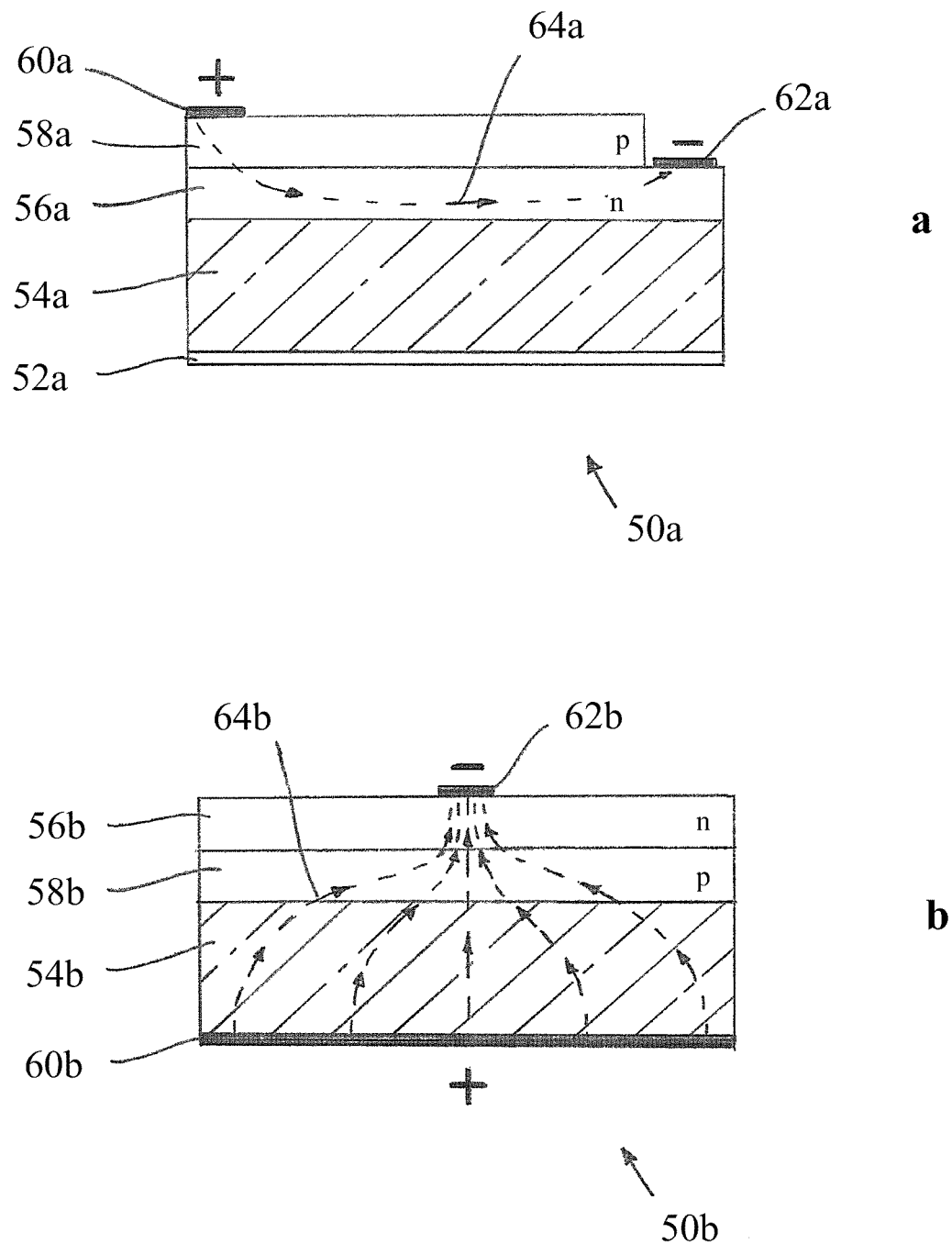
FIGS. 2a and 2b are schematic representations of a) "lateral" and b) "vertical" conducting surface emitting LED chip structures.

From a packaging perspective, LED chips (dies) can be broadly categorized into those which electrically conduct laterally and those which conduct vertically. FIGS. 2a and 2b are respectively simplified schematic representations of "lateral" and "vertical" conducting surface emitting GaN (gallium nitride) LED chip structures.

As is known a "lateral" conducting LED chip 50a comprises, in order, a back plate 52a, a substrate 54a (typically sapphire), an n-type GaN layer 56a and a p-type GaN layer 58a (FIG. 2a). Positive (+) 60a and negative (−) electrode contacts 62a are provided on the exposed surfaces of the p-type layer 58a and n-type layers 56a respectively. The LED chip 50a is operated by applying electrical power to the positive and negative electrode contacts. As shown in FIG. 2a electrical conduction 64a within a "lateral" LED chip structure occurs in a generally lateral direction between the electrode contacts. In summary in a "lateral" conducting LED chip both the positive and negative electrode contacts are located on the same face, typically the light emitting face, of the chip.

Similarly a "vertical" conducting LED chip 50b comprises, in order, a positive electrode plane 60b, an electrically conducting substrate 54b, a p-type GaN layer 58b and an n-type GaN layer 56b (FIG. 2b). In a "vertical" conducting structure the negative electrode 62b contact is provided on the upper surface of the n-type layer 56b and electrical conduction 64b occurs in a generally vertical direction between the electrode contacts. Thus in a "vertical" conducting LED chip the positive and negative electrode contacts are located on opposite faces of the chip.

Due to the different electrode contact configurations different packaging arrangements are required for light emitting devices based on "lateral" and "vertical" conducting LED chips.

Light Emitting Device With "Lateral" Conducting LED Chips

Figure 3:
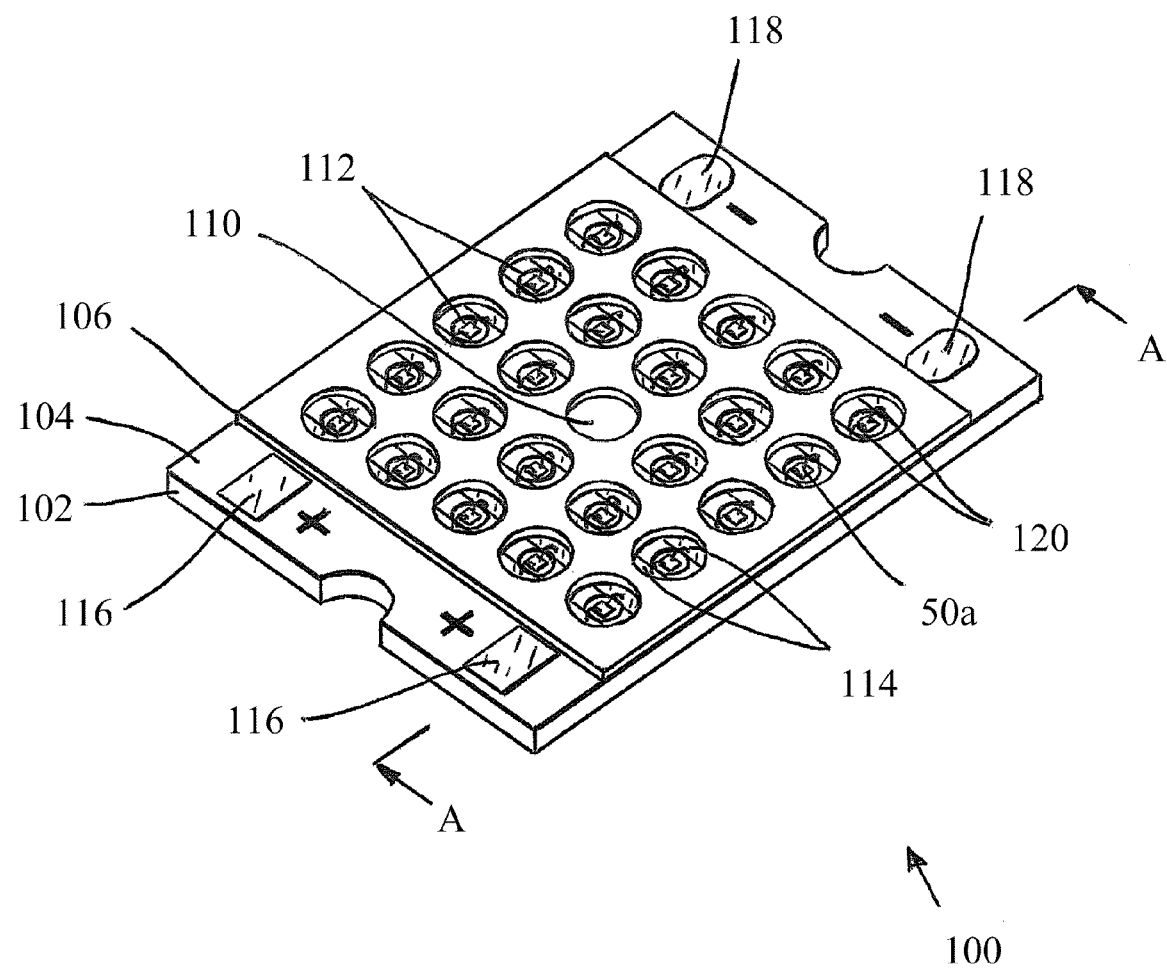
FIG. 3 is a schematic perspective view of a light emitting device using "lateral" conducting LEDs in accordance with a first embodiment of the invention.
Figure 4:
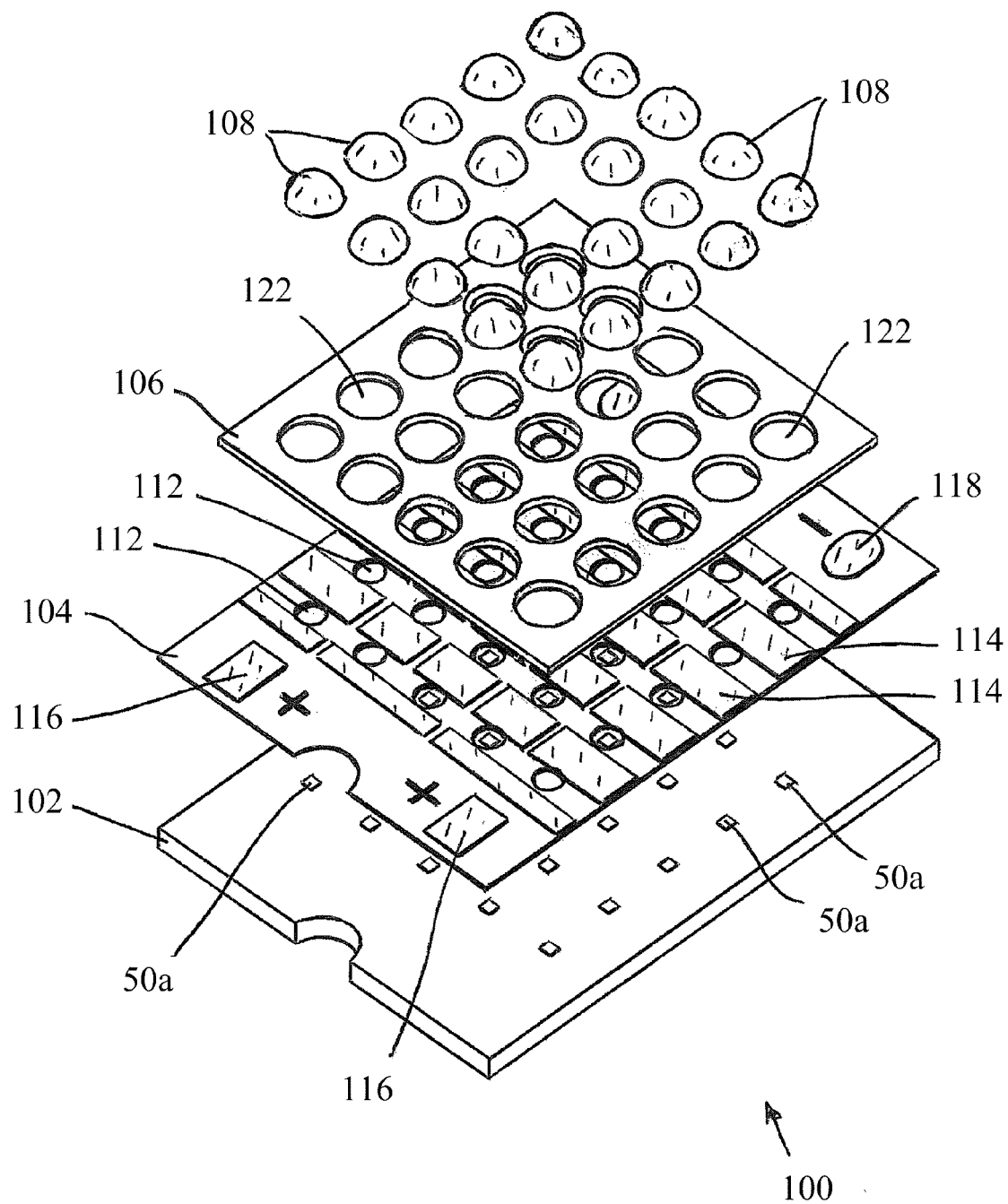
FIG. 4 is a partially exploded perspective view of the device of FIG. 3 illustrating its construction.
Figure 5:
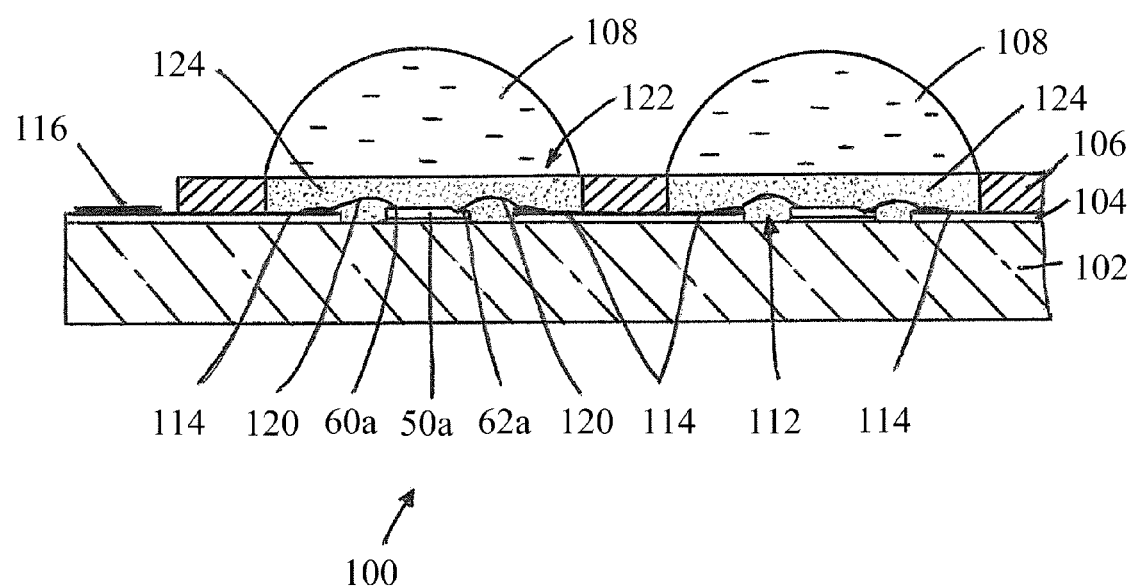
FIG. 5 is a schematic sectional representation of the light emitting device of FIG. 3 through a line A-A.

A light emitting device 100 in accordance with a first embodiment of the invention will now be described with reference to FIGS. 3, 4 and 5 in which FIG. 3 is a perspective view of the device, FIG. 4 is an exploded perspective view showing the device's construction and FIG. 5 is a schematic sectional view through a line A-A of FIG. 3. For ease of understanding no phosphor material is shown in FIGS. 3 and 4. The device 100 is configured to generate white light of a selected CCT (for example 5500K) and a luminous flux of order 600 lumens (approximately 12 W input power).

The device 100 is of a layered (laminated) construction and comprises three layers: a thermally conductive base (substrate) 102, a circuit layer 104, a cavity cover 106 and an array of lenses 108 (N.B. the lenses 108 are omitted in FIG. 3). The device further comprises twenty four 500 mW blue (i.e. dominant wavelength in a range ≈400 to ≈480 nm) surface emitting "lateral" conducting InGaN/GaN (indium gallium nitride/gallium nitride) based LED chips 50a that are arranged as a square array, five rows by five columns, with the center position 110 being left for another component such as a thermocouple (not shown). Although the device 100 is shown as comprising a square array of LED chips 50a it will be appreciated that the device of the invention applies to other LED chip configurations (e.g. hexagonal close packed) and numbers of LED chips depending on the required emission intensity (luminous flux).

The thermally conductive base 102 comprises a material with as high a thermal conductivity as possible, typically of the order at least 200 $Wm^{-1} K^{-1}$, to optimize the conduction of heat to the underside of the base. Generally the base 102 can comprise a metal and is preferably copper (Cu) whose thermal conductivity is ≈400 $Wm^{-1} K^{-1}$. Alternatively, the base 102 can comprise a copper alloy, aluminum (≈250 $Wm^{-1} K^{-1}$), anodized aluminum, an alloy of aluminum, a magnesium alloy or possibly a thermally conducting ceramic such as for example aluminum silicon carbide (AlSiC) (≈170 to 200 $Wm^{-1} K^{-1}$) or a carbon composite. Each LED chip 50a is mounted directly on, and in good thermal communication with, the base 102 by its base plate 52a by soldering with for example a gold-tin eutectic solder, using a solder paste for example a tin or silver solder paste or using a metal loaded epoxy such as a silver loaded epoxy. Other ways of attaching the LED chips (dies) 52a to the base will be apparent to those skilled in the art. In this specification "directly mounted" means mounted in direct thermal communication without intervening layer(s)

The circuit layer 104 preferably comprises a printed circuit board (PCB) such as for example an FR-4 (Fire Retardant-4) PCB and includes a square array of circular through-holes 112 which are configured such that each through-hole 112 corresponds to a respective one of the LED chips 50a. The size of the through-holes 112 is selected such that when the circuit layer 104 is mounted to the base 102 each through-hole 112 in conjunction with the base 102 defines a circular recess for housing a respective LED chip 50a. As is best seen in FIG. 4 a pattern of electrical conductors 114 is provided on an upper surface of the PCB 104 which define an electrical circuit configuration for electrically connecting the LED chips 50a in a desired circuit configuration. For the embodiment described the circuit layer is configured such that the LED chips 50a are electrically interconnected as four parallel series strings between positive (+) and negative (−) electrical connection pads 116, 118 in which each string comprises six serially connected LED chips. The electrical connection pads are also located on the upper surface of the PCB 104. Such a circuit configuration results in a forward voltage drop across each LED chip of ≈3.2 to 3.4V for a device drive voltage $V_F$ of 19.1 to 20.4V. The positive and negative electrode contacts 60a, 62a on the each LED chip 50a are electrically connected to a corresponding conductor 114 on the PCB by one or more bond wires 120 (see FIG. 5).

The cavity cover 106 is substantially planar in form and has a square array of circular through-holes 122 which are configured such that each through-hole 122 corresponds to a respective one of the LED chips 50a. In general each through-hole 122 is coaxial with a corresponding through-hole 112 in the circuit layer 104. The size of the through-holes 122 is selected such that when the cavity cover 106 is mounted on the circuit layer 104 each through-hole 122 defines a shallow circular recess (cup) that surrounds a respective LED chip 50a and bond wires 120. The cavity cover 106 preferably comprises a thermally conductive material with as high a thermal conductivity as possible, typically of the order at least 150 $Wm^{-1} K^{-1}$, and preferably of the order of at least 200 $Wm^{-1} K^{-1}$. The cover can be an electrically insulating material or electrically conductive and can comprise a metal such as copper (Cu), a copper alloy, aluminum, anodized aluminum, an alloy of aluminum, a magnesium alloy, a thermally conducting ceramic such as for example aluminum silicon carbide (AlSiC), a carbon composite or a high temperature polymer material. The wall of each through-hole 122 can be inclined and can include a light reflective surface such as a metallization layer of silver, aluminum or chromium. Having mounted the LED chips 50a to the base 102 and electrically connected each to the circuit layer 104 the cavity cover 106 is mounted to the PCB. Alternatively, the cover can be mounted to the substrate and the LED chips then mounted in a respective recess.

Each recess (cup) is then filled with a mixture of one or more phosphor materials and a light transmissive (transparent) material 124, typically a liquid polymer such as a silicone or an epoxy. Examples of light transmissive polymer materials can include Shin-Etsu MicroSi, Inc's flexible silicone KJR-9022 and GE's thermally curable silicone RTV615. Since the cavity cover 106 is essentially planar the recesses can conveniently be filled by sweeping (drawing) the phosphor/polymer mixture over the surface of the cavity cover using a flexible blade such as doctor blade, squeegee or alike. A benefit of such a method is that it eliminates the need to dispense a measured quantity of phosphors into each recess and reduces costs. Alternatively a measured volume of phosphor/polymer mixture can be dispensed into each cavity. The weight loading of the phosphor material to polymer material is typically in a range 10 to 50 parts per 100 and depends on the target emission color/CCT of the device. Advantageously, the light transmissive polymer is selected such that its refractive index n is as close to the refractive index of the LED chips 50a as practicable. For example, the refractive index of an InGaN/GaN LED chip is n≈2.4 to 2.5 whilst a high refractive index silicone has a refractive index n≈1.2 to 1.5. Thus in practice the polymer material typically has a refractive index n≧1.2. The use of a high refractive index polymer can increase emission of light from the LED chips 50a by providing a degree of refractive index matching. A respective lens 108 can then be mounted over each recess 122 to focus or otherwise direct the emission product from the device 100. The lenses 108 are fabricated from a light transmissive glass or polymer material such as a silicone or polycarbonate and can be in the form of individual lenses or an array of lenses.

A particular advantage of the packaging arrangement of the invention is that since each LED chip is mounted in direct thermal communication with a high thermal conductivity base this results in a package with a low thermal resistance. Additionally, the use of a circuit layer overlying the chips to provide electrical connection of the LED chips ensures complete electrical isolation from the base. This is beneficial for devices intended for use in general lighting, which are often required to operate from alternating current supplies of 110V (e.g. North America) or 220V (e.g. Europe). In addition having a respective recess 122 for each LED chip provides the benefit of reducing the quantity of phosphor material required as compared with known packages in which a single recess is used to house an array of LED chips. Moreover, the inventors have discovered that such a package has an increased brightness (luminous efficacy) compared to the known packages having the same quantity of phosphor material and the same number of LED chips. Additionally when the cover is made of a material that is a good thermal conductor, such a cover can provide heat sinking of the phosphor material and reduce potential thermal degradation of the phosphor material. Moreover, the use of a separate cavity cover 106 enables mounting and connection of the LED chips to be carried out on an essentially planar substrate allowing the use of chip on board (COB) fabrication techniques. Alternatively, the cover can mounted to the substrate and the LED chips then mounted to the substrate within a respective recess.

Figure 6A:
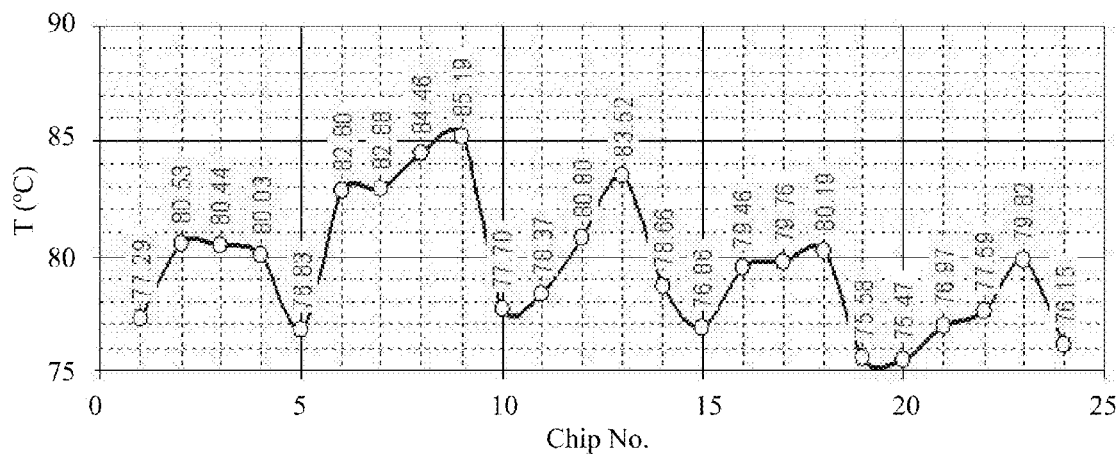
FIGS. 6a and 6b show measured surface temperature for each LED chip for a light emitting device in accordance with the invention for drive currents of a) 480 mA and b) 600 mA.
Figure 6B:
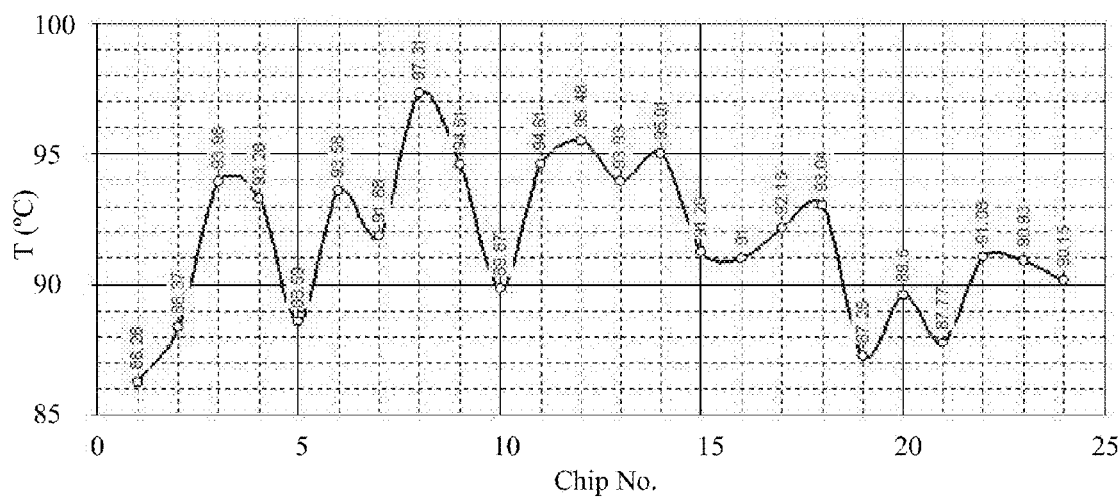

FIGS. 6*a* and 6*b* are the measured temperature (surface temperature) of each of the twenty four LED chips 50*a* for a 600 lumen light emitting device 100 in accordance with the invention with "lateral" conducting LED chips for forward drive currents $I_F$ of a) 480 mA and b) 600 mA. The numbers in these Figures are the actual LED chip surface temperatures. TABLE 1 shows thermal data for the 600 lumen light emitting device in accordance with the invention for forward drive currents $I_F$ of 480 mA and 600 mA. The thermal data were measured with the device 100 mounted on a 60×60×38 mm anodized aluminum heat sink (total surface area≈82,302 mm$^2$) within a still air enclosure (dimensions 600×600×600 mm).

In TABLE 1, $T_{min}$, $T_{max}$ and $T_{mean}$ are respectively the minimum, maximum and mean LED chip surface temperature, σ is the standard deviation in LED chip surface temperature, $T_C$ is the temperature for the center cavity 110, ΔT is the temperature difference between the mean chip temperature $T_{mean}$ and $T_a$ is the ambient temperature. TABLE 1 indicates that the thermal resistance $R_{JC}$ of the package is of order 1.2 to 1.4° C./W. For comparison a ceramic (e.g. LTCC) package typically has a thermal resistance of order 8 to 10° C./W and a plastic package has a thermal resistance of order 15° C./W. Accordingly the package of the present invention has a thermal resistance that is comparable with a COB arrangement in which the LED chips are mounted on the surface of an MCPCB. Calculations indicate that the thermal resistance of the polymer encapsulation is of order 240° C./W.

TABLES 2 and 3 give emission data for 600 lumen light emitting devices in accordance with the invention with nominal CCTs of 5500K and 2700K respectively. Data is given for forward drive currents $I_F$ of 480 mA and 600 mA for devices with and without the lenses 108.

TABLE 2

Emission data for a 600 lumen (5500K) light emitting device with lateral conducting LED chips for forward drive currents $I_F$ of 480 and 680 mA with and without lenses

| $I_F$ (mA) | $V_F$ (V) | Luminous flux (lm) | Luminous efficacy (lm/W) | Chromaticity CIE x | CIE y | CCT (K) | CRI |
|---|---|---|---|---|---|---|---|
| Without lenses ||||||||
| 480 | 19.64 | 485 | 54.7 | 0.3289 | 0.3233 | 5711 | 60.3 |
| 600 | 20.31 | 588 | 51.1 | 0.3297 | 0.3250 | 5622 | 60.1 |
| With lenses ||||||||
| 480 | 19.70 | 541 | 61.5 | 0.3108 | 0.2944 | 7154 | 64.8 |
| 600 | 20.37 | 656 | 58.0 | 0.3177 | 0.2961 | 7051 | 63.8 |

TABLE 3

Emission data for a 600 lumen (2700K) light emitting device with lateral conducting LED chips for forward drive currents $I_F$ of 480 and 680 mA with and without lenses

| $I_F$ (mA) | $V_F$ (V) | Luminous flux (lm) | Luminous efficacy (lm/W) | CIE chromaticity CIE x | CIE y | CCT (K) | CRI |
|---|---|---|---|---|---|---|---|
| Without lenses ||||||||
| 480 | 19.64 | 517 | 51.3 | 0.4421 | 0.4025 | 2902 | 48.2 |
| 600 | 20.30 | 624 | 48.1 | 0.4420 | 0.4033 | 2912 | 48.0 |
| With lenses ||||||||
| 480 | 19.70 | 587 | 57.2 | 0.4255 | 0.3911 | 3095 | 50.9 |
| 600 | 20.35 | 708 | 53.7 | 0.4255 | 0.3920 | 3102 | 50.8 |

Light Emitting Device With "Vertical" Conducting LED Chips

Figure 7:
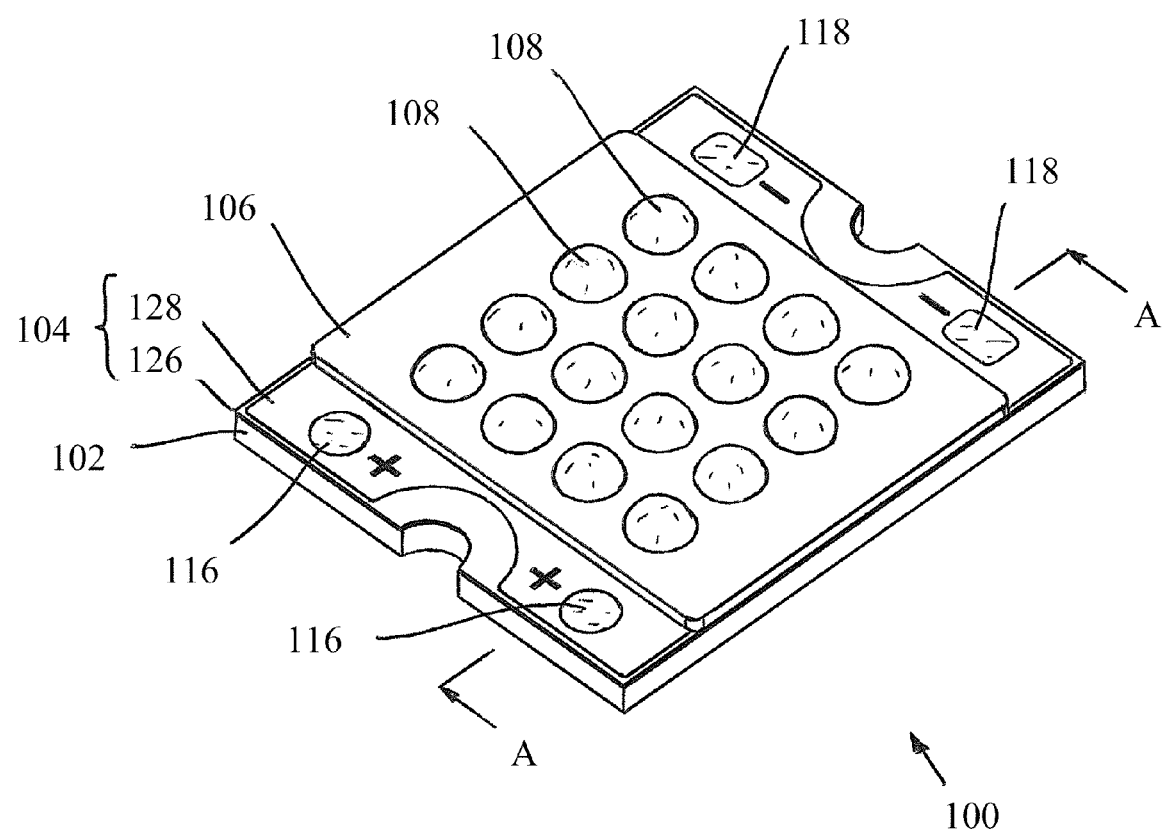
FIG. 7 is a schematic perspective view of a light emitting device using "vertical" conducting LED chips in accordance with a second embodiment of the invention.
Figure 8:
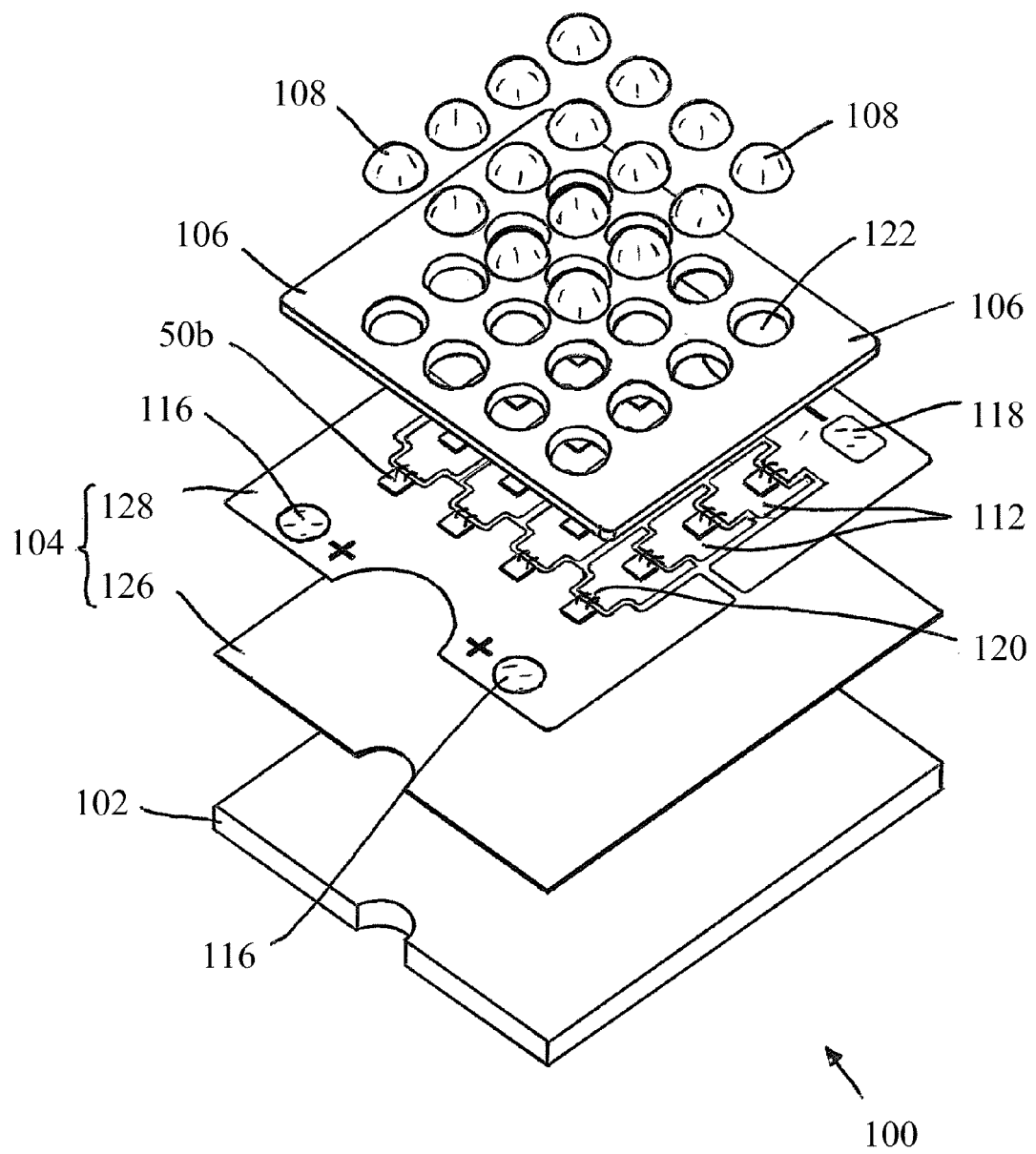
FIG. 8 is a partially exploded perspective view of the device of FIG. 6 illustrating its construction.
Figure 9:
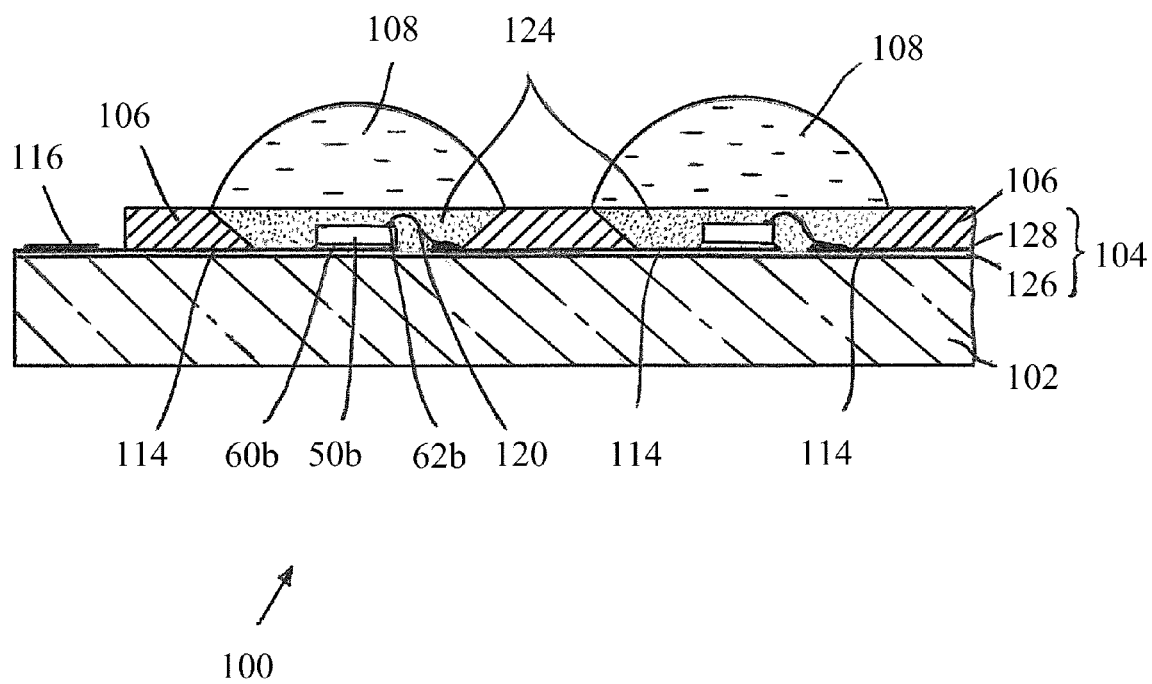
FIG. 9 is a schematic sectional representation of the light emitting device of FIG. 6 through a line A-A.

A light emitting device 100 in accordance with a second embodiment of the invention will now be described with reference to FIGS. 7, 8 and 9 in which FIG. 7 is a perspective view of the device, FIG. 8 is an exploded perspective view showing the device's construction and FIG. 9 is a schematic sectional view through a line A-A of FIG. 7. The device 100 is configured to generate white light of a selected CCT and a luminous flux of order 1000 lumens (approximately 21 W input power).

In common with the device described above the device 100 comprises three layers: a thermally conductive base 102, a

TABLE 1

Thermal data for a 600 lumen light emitting device with lateral conducting LED chips for forward drive currents $I_F$ of 480 and 680 mA

| $I_F$ (mA) | $V_F$ (V) | T (° C.) |||| $T_C$ (° C.) | ΔT (° C.) | $T_a$ (° C.) | $R_{JC}$ (° C./W) |
| | | $T_{min}$ | $T_{max}$ | $T_{mean}$ | σ | | | | |
|---|---|---|---|---|---|---|---|---|---|
| 480 | 19.14 | 75.5 | 85.2 | 80.0 | 2.775 | 67.2 | 12.8 | 25.6 | 1.360 |
| 600 | 19.62 | 86.3 | 97.3 | 92.0 | 2.868 | 77.6 | 14.4 | 26.1 | 1.214 | circuit layer 104, a cavity cover 106 and an array of lenses 108. The base 102 comprises a material with as high a thermal conductivity as possible (typically of the order of at least 200 $Wm^{-1} K^{-1}$) such as a metal and is preferably made of copper. In this embodiment the circuit layer 104 comprises an electrically insulating, thermally conductive film 126 deposited on the base 102 on which a pattern of electrical conductors 114 is then formed. Preferably the thermally conductive film 126 comprises a diamond like carbon (DLC), also known as "amorphous carbon" or "amorphous diamond", which as is known is an electrical insulator with a thermal conductivity that can be comparable to a metal. Typically the DLC film 126 is of a thickness of the order of 5 to 50 μm and is deposited onto the base 102 using for example CVD (chemical vapor deposition). The electrical conductors 114 preferably comprise a layer 128 of copper deposited onto the DLC film 126. In the example illustrated the device comprises sixteen 1.3 W blue (i.e. wavelength≈400 to 480 nm) surface emitting "vertical" conducting InGaN/GaN (indium gallium nitride/gallium nitride) based light emitting diode (LED) chips 50b that are arranged as a square array, four rows by four columns.

Each LED chip 50a is, by means of its positive electrode plane 60b, mounted on and electrically connected to a respective electrical conductor 114 by soldering with for example a gold-tin eutectic solder, using a solder paste for example a tin or silver solder paste or using a metal loaded epoxy such as a silver loaded epoxy. As is best seen in FIG. 7 the pattern of electrical conductors 114, which conductors are generally rectangular in form, is configured to provide each LED chip with as large a surface area as possible to maximize heat dissipation into the base 102 through the film 126. In the example shown the LED chips 50b are interconnected as four parallel strings between the positive (+) and the negative (−) electrical connection pads 116, 118 in which each string comprises four series connected LED chips. Such a circuit configuration results in a forward voltage drop across each LED chip≈3.5 to 3.7V for a device drive voltage $V_F$ of order 14.3 to 14.8V (i.e.). As shown in FIGS. 7 and 8 the negative electrode contacts 62b of each LED chip 50b are electrically connected to a corresponding conductor 114 by one or more bond wires 120.

As in the first embodiment the planar cavity cover 106 has a square array of circular through-holes 122 which are configured such that each through-hole 122 corresponds to a respective one of the LED chips 50b. The size of the through-holes 122 is selected such that when the cavity layer 106 is mounted to the circuit layer 104 each through-hole 122 defines a circular recess (cup) surrounding a respective LED chip 50b. The wall of each through-hole 122 can, as shown, be inclined and include a light reflective surface such as a metallization layer of silver, aluminum or chromium. The angle of inclination can be selected to maximize light emission and to give a desired emission pattern and is typically in a range 30° to 60° to the face of the cover. Having mounted each LED chip 50b to a respective conductor 114 and electrically connected each to the circuit layer 104 the cavity layer 106 is mounted to the circuit layer 104. The cavity cover 106 preferably comprises a thermally conductive material with as high a thermal conductivity as possible, typically of the order at least 150 $Wm^{-1} K^{-1}$, and preferably of the order of at least 200 $Wm^{-1} K^{-1}$. The cavity cover can be an electrically insulating or an electrically conductive material and can comprise a metal such as copper (Cu), a copper alloy, aluminum, anodized aluminum, an alloy of aluminum, a magnesium alloy, a thermally conducting ceramic such as for example aluminum silicon carbide (AlSiC) or a carbon composite or a high temperature polymer material.

Finally each recess 122 can be potted (filled) with a mixture of one or more phosphor materials and a light transmissive (transparent) material 124, typically a polymer such as a silicone or an epoxy. The weight loading of the at least one phosphor material to polymer material is typically in a range 10 to 50 parts per 100 and depends on the target emission color/CCT of the device.

As shown a respective lens 108 can then be mounted over each recess 122 to focus or otherwise direct the emission product from the device.

Table 4 shows measured emission data for a 1000 lumen light emitting device in accordance with the invention with "vertical" conducting LED chips with a nominal CCT of 3000K. Data is given for devices with and without the lenses 108.

TABLE 4

Emission data for a 1000 lumen (3000K) light emitting device with vertical conducting LED chips with and without lenses

| $V_F$ (V) | Luminous flux (lm) | Luminous efficacy (lm/W) | CIE (x) | CIE (y) | CCT (K) | CRI |
|---|---|---|---|---|---|---|
| Without lenses | | | | | | |
| 14.83 | 916 | 44.17 | 0.4312 | 0.3913 | 2993 | 49.4 |
| With lenses | | | | | | |
| 14.32 | 999 | 47.89 | 0.4196 | 0.3815 | 3123 | 51.6 |

In devices of the invention according to either embodiment (i.e. those based on "lateral" or "vertical" LED conducting chips) the cavity cover 106 is preferably attached to the circuit layer 104 once the LED chips have been mounted and connected to the circuit layer. This can make fabrication of the device easier since the LED chips are being mounted on a generally planar substrate enabling the use of automated chip on board (COB) fabrication techniques. Additionally a separate cavity cover enables easy lens attachment and also reduces the quantity of phosphor material required as compared with known devices in which each cavity houses a number of LED chips. Moreover, the use of a cavity cover that is thermally conductive provides heat sinking of the phosphor material and reduces potential thermal degradation of the phosphor material.

The devices of the invention are suitable for any phosphor material(s) in a powder form and can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in co-pending U.S. patent application publication No. US 2007/0029526 A1 and U.S. Pat. No. 7,311,858 B2, U.S. Pat. No. 7,575,697 B2 and U.S. Pat. No. 7,601,276 B2 the content of each of which is hereby incorporated by way of reference thereto.

As taught in U.S. Pat. No. 7,575,697 B2, a europium ($Eu^{2+}$) activated silicate-based green phosphor has the general formula $(Sr,A_1)_x(Si,A_2)(O,A_3)_{2+x}:Eu^{2+}$ in which: $A_1$ is at least one of a $2^+$ cation, a combination of $1^+$ and $3^+$ cations such as for example Mg, Ca, Ba, zinc (Zn), sodium (Na), lithium (Li), bismuth (Bi), yttrium (Y) or cerium (Ce); $A_2$ is a $3^+$, $4^+$ or $5^+$ cation such as for example boron (B), aluminum (Al), gallium (Ga), carbon (C), germanium (Ge), N or phosphorus (P); and $A_3$ is a $1^-$, $2^-$ or $3^-$ anion such as for example F, Cl, bromine (Br), N or S. The formula is written to indicate that the $A_1$ cation replaces Sr; the $A_2$ cation replaces Si and the $A_3$ anion replaces oxygen. The value of x is an integer or non-integer between 1.5 and 2.5.

U.S. Pat. No. 7,311,858 B2 disclose a silicate-based yellow-green phosphor having a formula $A_2SiO_4:Eu^{2+}$ D, where A is at least one of a divalent metal comprising Sr, Ca, Ba, Mg, Zn or cadmium (Cd); and D is a dopant comprising F, Cl, Br, iodine (I), P, S and N. The dopant D can be present in the phosphor in an amount ranging from about 0.01 to 20 mole percent and at least some of the dopant substitutes for oxygen anions to become incorporated into the crystal lattice of the phosphor. The phosphor can comprise $(Sr_{1-x-y}Ba_xM_y)SiO_4$: $Eu^{2+}$D in which M comprises Ca, Mg, Zn or Cd and where $0 \leq x \leq 1$ and $0 \leq y \leq 1$.

U.S. Pat. No. 7,601,276 B2 teach a two phase silicate-based phosphor having a first phase with a crystal structure substantially the same as that of $(M1)_2SiO_4$; and a second phase with a crystal structure substantially the same as that of $(M2)_3SiO_5$ in which M1 and M2 each comprise Sr, Ba, Mg, Ca or Zn. At least one phase is activated with divalent europium ($Eu^{2+}$) and at least one of the phases contains a dopant D comprising F, Cl, Br, S or N. It is believed that at least some of the dopant atoms are located on oxygen atom lattice sites of the host silicate crystal.

US 2007/0029526 A1 disclose a silicate-based orange phosphor having the formula $(Sr_{1-x}M_x)_yEu_zSiO_5$ in which M is at least one of a divalent metal comprising Ba, Mg, Ca or Zn; $0<x<0.5$; $2.6<y<3.3$; and $0.001<z<0.5$. The phosphor is configured to emit visible light having a peak emission wavelength greater than about 565 nm.

The phosphor can also comprise an aluminate-based material such as is taught in co-pending U.S. patent application publication No. US 2006/0158090 A1 and U.S. Pat. No. 7,390,437 B2 or an aluminum-silicate phosphor as taught in co-pending U.S. application publication No. US 2008/0111472 A1 the content of each of which is hereby incorporated by way of reference thereto.

US 2006/0158090 A1 to Wang et al. teach an aluminate-based green phosphor of formula $M_{1-x}Eu_xAl_yO_{[1+y/2]}$ in which M is at least one of a divalent metal comprising Ba, Sr, Ca, Mg, manganese (Mn), Zn, copper (Cu), Cd, samarium (Sm) or thulium (Tm) and in which $0.1<x<0.9$ and $0.5 \leq y \leq 12$.

U.S. Pat. No. 7,390,437 B2 disclose an aluminate-based blue phosphor having the formula $(M_{1-x}Eu_x)_{2-z}Mg_zAl_yO_{[2+3y/2]}$ in which M is at least one of a divalent metal of Ba or Sr. In one composition the phosphor is configured to absorb radiation in a wavelength ranging from about 280 nm to 420 nm, and to emit visible light having a wavelength ranging from about 420 nm to 560 nm and $0.05<x<0.5$ or $0.2<x<0.5$; $3 \leq y \leq 12$ and $0.8 \leq z \leq 1.2$. The phosphor can be further doped with a halogen dopant H such as Cl, Br or I and be of general composition $(M_{1-x}Eu_x)_{2-z}Mg_zAl_yO_{[2+3y/2]}:H$.

US 2008/0111472 A1 to Liu et al. teach an aluminum-silicate orange-red phosphor with mixed divalent and trivalent cations of general formula $(Sr_{1-x-y}M_xT_y)_{3-m}Eu_m(Si_{1-z}Al_z)O_5$ in which M is at least one divalent metal selected from Ba, Mg or Ca in an amount ranging from $0 \leq x \leq 0.4$; T is a trivalent metal selected from Y, lanthanum (La), Ce, praseodymium (Pr), neodymium (Nd), promethium (Pm), Sm, gadolinium (Gd), terbium (Tb), dysprosium (Dy), holmium (Ho), Erbium (Er), Tm, ytterbium (Yt), lutetium (Lu), thorium (Th), protactinium (Pa) or uranium (U) in an amount ranging from $0 \leq y \leq 0.4$ and z and m are in a range $0 \leq z \leq 0.2$ and $0.001 \leq m \leq 0.5$. The phosphor is configured such that the halogen resides on oxygen lattice sites within the silicate crystal.

The phosphor can also comprise a nitride-based red phosphor material such as is taught in co-pending U.S. patent applications Publication No. US 2009/0283721 A1 published Nov. 19, 2009 and Ser. No. 12/632,550 filed Dec. 7, 2009 entitled "Nitride-based red-emitting phosphors in RGB (red-green-blue) lighting systems", the content of each of which is hereby incorporated by way of reference thereto. US 2009/0283721 A1 and Ser. No. 12/632,550 teach nitride-based red phosphor having the formula $M_mM_aM_bD_{3w}N_{[(2/3)m+z+a+(4/3)b-w]}Z_x$ where $M_m$ is a divalent element selected from beryllium (Be), Mg, Ca, Sr, Ba, Zn, Cd or mercury (Hg); $M_a$ is a trivalent element selected from B, Al, Ga, indium (In), Y, selenium (Se), P, arsenic (As), La, Sm, antimony (Sb) or Bi; $M_b$ is a tetravalent element selected from C, Si, Ge, tin (Sn), Ni, hafnium (Hf), molybdenum (Mo), tungsten (W), chromium (Cr), lead (Pb), titanium (Ti) or zirconium (Zr); D is a halogen selected from F, Cl, Br or I; Z is an activator selected from europium (Eu), Ce, manganese (Mn), Tb or samarium (Sm), and N is nitrogen in amounts $0.01 \leq m \leq 1.5$, $0.01 \leq a \leq 1.5$, $0.01 \leq b \leq 1.5$, $0.0001 \leq w \leq 0.6$ and $0.0001 \leq z \leq 0.5$. The phosphor is configured to emit visible light with an emission peak wavelength greater than 640 nm.

It will be appreciated that the phosphor material is not limited to the examples described herein and can comprise any phosphor material including both organic or inorganic phosphor materials such as for example nitride and/or sulfate phosphor materials, oxy-nitrides and oxy-sulfate phosphors or garnet materials (YAG).

It will be further appreciated that the present invention is not restricted to the specific embodiments described and that variations can be made that are within the scope of the invention. For example, devices in accordance with the invention can comprise other LED chips such as silicon carbide (SiC), zinc selenide (ZnSe), indium gallium nitride (InGaN), aluminum nitride (AlN) or aluminum gallium nitride (AlGaN) based LED chips that emit blue or U.V. light.

Moreover the package in accordance with the first embodiment can also be used to package "vertical" conducting LED chips where it is required that the electrode plane of each LED chip be connected together in a parallel circuit configuration.

What is claimed is:

1. A light emitting device comprising:
   a) a plurality of LED chips operable to generate light having a dominant wavelength in a first wavelength range; and
   b) a package for housing the LED chips,
   wherein the package comprises:
   c) a thermally conductive substrate on which the LED chips are mounted in thermal communication;
   c1) an electrical circuit arrangement mounted on the substrate wherein the circuit arrangement has a plurality of through-holes which are configured such each LED chip is directly mounted to the substrate;
   d) a cover having a plurality of through-holes in which each hole corresponds to a respective one of the LED chips and wherein the holes are configured such that when the cover is mounted to the substrate each hole in conjunction with the substrate defines a recess in which a respective LED chip is housed,
   e) a mixture of at least one phosphor material and a light transmissive material within the through-holes such that the cover and the mixture form a substantially planar surface;

wherein the at least one phosphor material is configured to absorb at least a portion of said light and to emit light having a dominant wavelength in a second wavelength range; and f) a plurality of lenses each physically mounted on a respective one of the plurality of through-holes;

wherein the plurality of lenses are one of pre-fabricated individually and pre-fabricated as an array.

2. The device according to claim 1, in which the package has a thermal resistance less than 5° C./W.

3. The device according to claim 1, in which the emission product of the device comprises a combination of light of the first and second wavelength ranges.

4. The device according to claim 3, in which the emission product is white light.

5. The device according to claim 1, in which the substrate has a thermal conductivity of at least 200 $Wm^{-1}K^{-1}$.

6. The device according to claim 5, in which the substrate is selected from the group consisting of: copper, a copper alloy, aluminum, an aluminum alloy, a magnesium alloy, a thermally conducting ceramic, aluminum silicon carbide and a carbon composite.

7. The device according to claim 1, in which the cover is thermally conductive and has a thermal conductivity of at least 150 $Wm^{-1}K^{-1}$.

8. The device according to claim 7, in which the cover is selected from the group consisting of: copper, a copper alloy, aluminum, an aluminum alloy, a magnesium alloy, a thermally conducting ceramic, aluminum silicon carbide and a carbon composite.

9. The device according to claim 1, and further comprising electrically connecting each LED chip to the circuit arrangement.

10. The device according to claim 1, in which the circuit arrangement comprises a printed circuit board.

11. The device according to claim 1, in which the LED chips are "lateral" conducting chips.

12. The device according to claim 1, and further comprising on the substrate an electrically insulating thermally conductive layer having an arrangement of electrical conductors on a surface thereof and wherein each LED chip is mounted to an electrical conductor.

13. The device according to claim 12, in which the thermally conductive layer comprises diamond like carbon.

14. The device according to claim 12, in which the LED chips are "vertical" conducting chips.

15. A light emitting device comprising:
a) a plurality of LED chips operable to generate light having a dominant wavelength in a first wavelength range; and
b) a package for housing the LED chips,
wherein the package comprises:
c) a thermally conductive substrate on which the LED chips are mounted in direct thermal communication;
d) an electrical circuit arrangement mounted on the substrate wherein the circuit arrangement has a plurality of through-holes which are configured such that each LED chip is mounted to the substrate in direct thermal communication;
e) a cover having a plurality of through-holes in which each hole corresponds to a respective one of the LED chips and wherein the holes are configured such that when the cover is mounted to the circuit arrangement each hole in conjunction with the circuit arrangement defines a recess in which a respective LED chip is housed; and wherein f) each recess is filled with a mixture of at least one phosphor material and a light transmissive material such that a substantially planar surface is formed, the at least one phosphor material being configured to absorb at least a portion of light of the first wavelength range and to emit light having a dominant wavelength in a second wavelength range; and g) a plurality of lenses each physically mounted on a respective one of the plurality of through-holes;

wherein the plurality of lenses are one of pre-fabricated individually and pre-fabricated as an array.

16. A light emitting device comprising:
a) a plurality of LED chips operable to generate light having a dominant wavelength in a first wavelength range; and
b) a package for housing the LED chips,
wherein the package comprises:
c) a thermally conductive substrate;
c1) an electrically insulating thermally conducting layer having a thickness of about 50 um or less formed on the substrate;
d) an electrical circuit arrangement formed on the electrically insulating thermally conducting layer wherein the circuit arrangement comprises an arrangement of electrical conductors on a surface thereof and wherein each LED chip is mounted to an electrical conductor;
e) a cover having a plurality of through-holes in which each hole corresponds to a respective one of the LED chips and wherein the holes are configured such that when the cover is mounted to the circuit arrangement each hole in conjunction with the circuit arrangement defines a recess in which a respective LED chip is housed; and wherein
f) each recess is at least partially filled with a light transmissive material.

17. A package for a light emitting device comprising a plurality of LED chips operable to generate light having a dominant wavelength in a first wavelength range; the package comprising:
a) a thermally conductive substrate on which the LED chips are mountable;
a1) an electrical circuit arrangement mounted on the substrate wherein the circuit arrangement has a plurality of through-holes which are configured such each LED chip is directly mounted to the substrate;
b) a cover having a plurality of through-holes in which each hole corresponds to a respective one of the LED chips and wherein the holes are configured such that when the cover is mounted to the substrate each hole in conjunction with the substrate defines a recess in which a respective LED chip is housed;
c) a mixture of at least one phosphor material and a light transmissive material within the through-holes such that the cover and the mixture form a substantially planar surface;
wherein the at least one phosphor material is configured to absorb at least a portion of said light and to emit light having a dominant wavelength in a second wavelength range; and
d) a plurality of lenses each physically mounted on a respective one of the plurality of through-holes;
wherein the plurality of lenses are one of pre-fabricated individually and pre-fabricated as an array.

18. The package according to claim 17, in which the package has a thermal resistance less than 5° C./W.

19. The light emitting device according to claim 16, wherein each recess is at least partially filled with a mixture of at least one phosphor material and a light transmissive material, the at least one phosphor material being configured to absorb at least a portion of light of the first wavelength range and to emit light having a dominant wavelength in a second wavelength range.

20. The light emitting device according to claim 16, in which the thermally conductive layer is diamond like carbon.

21. The light emitting device according to claim 16, in which the substrate is selected from the group consisting of: copper, a copper alloy, aluminum, an aluminum alloy, a magnesium alloy, a thermally conducting ceramic, aluminum silicon carbide and a carbon composite.

22. The light emitting device according to claim 16, in which the cover is selected from the group consisting of: copper, a copper alloy, aluminum, an aluminum alloy, a magnesium alloy, a thermally conducting ceramic, aluminum silicon carbide and a carbon composite.

* * * * *